United States Patent

[11] 3,614,649

[72] Inventor John S. Gerig
McLean, Va.
[21] Appl. No. 887,957
[22] Filed Dec. 24, 1969
[45] Patented Oct. 19, 1971
[73] Assignee Reaction Instruments, Incorporated
Vienna, Va.

[54] FREQUENCY STABILIZATION OF CONTINUOUSLY TUNABLE OSCILLATORS
7 Claims, 5 Drawing Figs.

[52] U.S. Cl. 331/17, 331/32, 331/135, 331/167
[51] Int. Cl. H03b 3/04
[50] Field of Search 331/1, 17, 30, 32, 135, 167

[56] References Cited
UNITED STATES PATENTS

| | | | |
|---|---|---|---|
| 2,716,704 | 8/1955 | Norton | 331/30 X |
| 2,912,637 | 11/1959 | Barnes et al. | 331/1 X |
| 3,289,096 | 11/1966 | Longuemare, Jr. et al. | 331/1 |
| 3,323,077 | 5/1967 | Sigorsky et al. | 331/135 X |

*Primary Examiner*—Roy Lake
*Assistant Examiner*—Siegfried H. Grimm
*Attorney*—John E. Benoit

ABSTRACT: A voltage controlled oscillator with a controllable phase shifter and a delay line connected in series with the output of the oscillator. A phase discriminator measures the phase difference between the output of the oscillator and the output of the delay line and feeds back a difference signal which, suitably conditioned, dynamically stabilizes the frequency of the oscillator.

Figure 1:
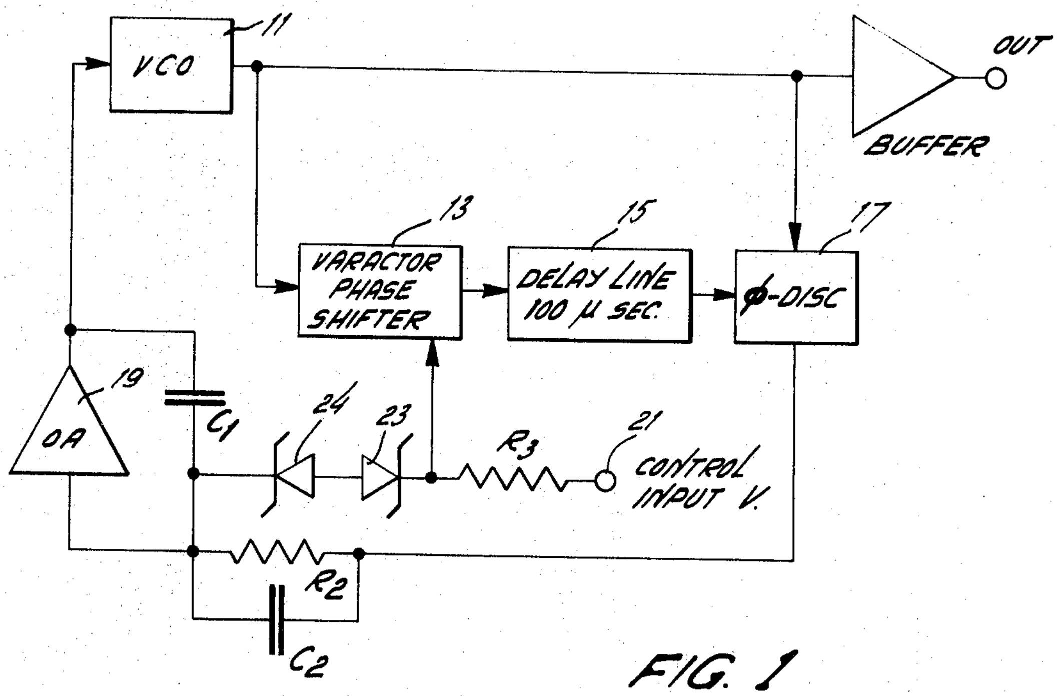

INVENTOR
JOHN S. GERIG

BY Schulze Blair & Daniel

ATTORNEY

INVENTOR
JOHN S. GERIG
BY Schulz, Blair & Benoit
ATTORNEY

FREQUENCY STABILIZATION OF CONTINUOUSLY TUNABLE OSCILLATORS

This invention relates generally to an electronically controlled oscillator and more specifically to an ultrastable voltage controlled oscillator.

A number of systems in use today require the use of controlled oscillators. In some such systems, oscillators are required which are extremely stable. One such application is in low-noise frequency synthesizers.

It is generally accepted that in frequency synthesizer applications where extremely low noise and fast switching are important, direct synthesis methods must be used. Unfortunately, direct synthesis designs tend to be large and costly, and for less critical applications, the so-called "divide-by-N" synthesizer is preferred. In the "divide-by-N" method, a voltage controlled oscillator (VCO) is phase-locked to the *n*th harmonic of a reference frequency $F_R$. The frequency ratio N is determined by appropriate inputs to digital frequency divider circuitry in the synthesizer, which can be implemented largely from IC logic.

In the simplest form of the "divide-by-N" synthesizer, frequency resolution is determined by $F_R$ so that if tuning in 100 Hz. steps is desired, the reference frequency $F_R$ must also be 100 Hz.

The pulse phase comparator which develops the control input to the VCO may be considered a form of a sampled-data system, the sampling rate corresponding to the reference frequency used. Since the VCO control voltage can be updated only at intervals corresponding to this reference frequency, it follows that the short term stability of the VCO must be so excellent that phase drift or random frequency variations accumulated during the interval from one sample to the next will be extremely low. Otherwise, excessive variations in the correction voltage will be generated and these will produce unwanted noise sidebands on the output spectrum of the synthesizer.

For many synthesizer applications, a wide tuning range is also needed. A problem which then arises is that of achieving good short term frequency stability in the VCO together with wide tuning range. Even if an ideal (i.e., noise free) VCO is postulated, there is still the problem of signal-to-noise ratio at the control input to the VCO. Thus if the total tuning range of the VCO corresponds to a 10 volt swing in control voltage, and if a short term stability of 1 p.p.m. is desired, then the noise or spurious signal level on the control voltage line must be less than 10 microvolts. This requirement places a severe limitation on the sample-and-hold circuit and on the error filter used within the control loop as this filter must also satisfy contraints pertaining to servo-loop stability.

The synthesizer described above is only one example of the usefulness which would be provided by an ultrastable voltage controlled oscillator.

Accordingly, it is an object of this invention to provide an ultrastable voltage controlled oscillator which greatly improves the tradeoff between short term stability and wide tuning range.

A further object of this invention is to incorporate a delay line in a voltage controlled oscillator circuit so as to improve the short term stability of the oscillator.

Figure 2A:
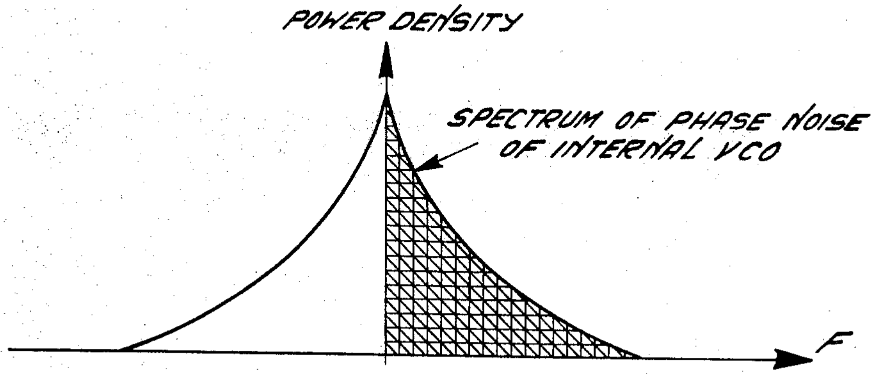
Figure 2B:
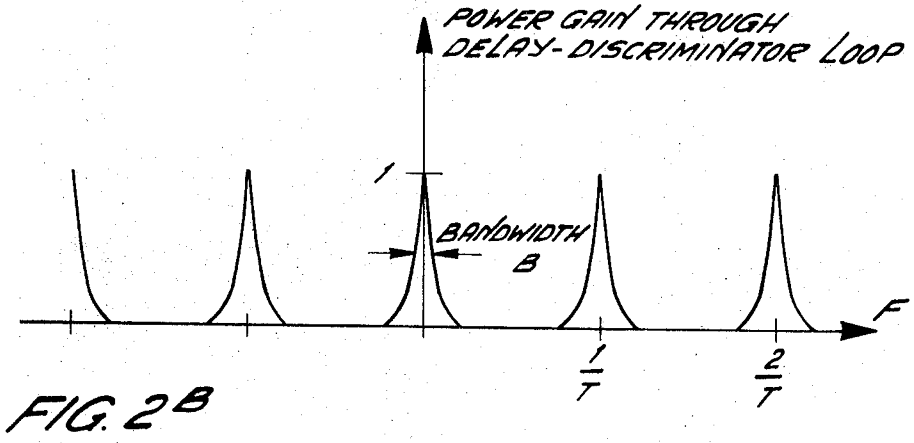
Figure 2C:
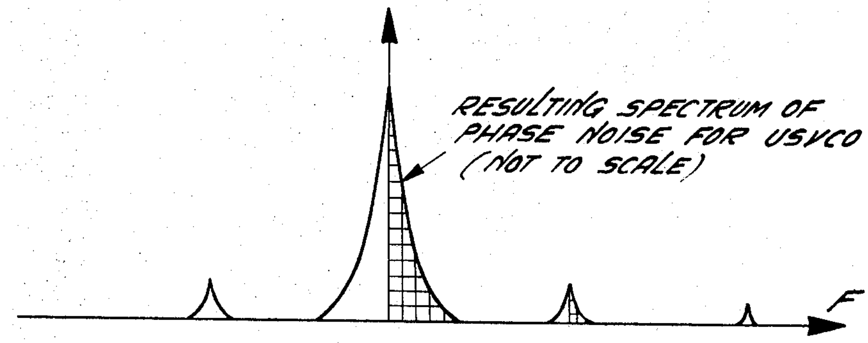

These and other objects will be more fully understood from the following description taken together with the drawings wherein FIG. 1 is a schematic diagram of one embodiment of the present invention, and FIGS. 2A, 2B and 2C illustrate the phase noise spectra of the oscillator of the present invention.

Figure 3:
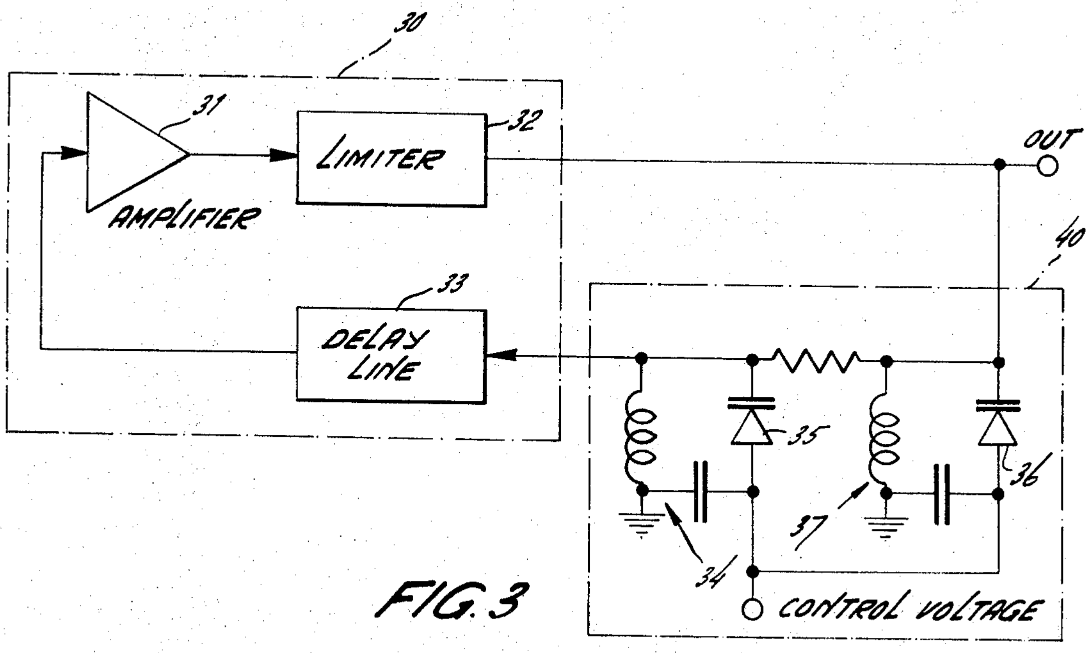

FIG. 3 is a schematic of a modified form of the present invention.

Broadly, the present invention relates to a frequency stabilized tunable oscillator system comprising a controlled oscillator, a delay line having a bandwidth encompassing the desired tuning range of the oscillator and being driven by the oscillator, a controllable phase shifter connected in series with the delay line and means for measuring the phase difference between the output signal from the delay line and the output signal from the oscillator for dynamically controlling the frequency of the oscillator in accordance with the phase difference.

Although the present invention is described in terms of a "-voltage" controlled oscillator, it is clear that the invention can also be used with other forms of controlled oscillators as, for example, current-controlled oscillators or oscillators controlled by varying a magnetic field such as commercially available YIG-tuned oscillators.

The short term frequency stability of a conventional oscillator is directly proportional to the Q factor of the resonator used in it. The significance of a high Q factor is that it implies a large phase slope, i.e., a large rate of change of phase with frequency. A large phase-slope means that random or systematic phase shifts introduced external to the resonator produce relatively small frequency changes. Unfortunately, high Q factor goes with narrow bandwidth in a conventional resonator.

A circuit element which combines large bandwidth and high phase slope is a delay line. Therefore, a delay line effectively imbedded in a VCO circuit would improve the short term stability of the VCO. Alternative designs in which the delay line is either within the primary RF feedback loop of the oscillator or external to it could be used. The latter approach has the particular advantage of making large variations in the insertion loss of the delay line noncritical and is, therefore, the preferred embodiment for most applications.

FIG. 1 illustrates a possible design for such a stabilized VCO. To facilitate explanation, typical numerical values will be used in the discussion of this design. However, it is to be understood that such values in no way limit the invention as set forth. RF energy in the range of 3 to 4 MHz. is generated by a conventional varactor-tuned oscillator 11. A sample of the oscillator output is passed through a varactor phase-shifter 13 whose design may be such that a variation in control voltage such as from −5 volts to +5 volts produces altogether a 360° variation in phase shift. The phase shifted output is passed through a delay line 15 having, for example, a delay of 70 microseconds, and the delayed RF signal is then compared in phase with the direct output of the oscillator 11 in a phase discriminator such as a balanced modulator.

Supposing for a moment that the oscillator frequency is swept upwards, there will be a sinusoidal variation in the output voltage from the discriminator 17, one complete cycle being described for every 14 kHz. increment in oscillator frequency, 14 kHz. being, in round numbers, the frequency whose periods is 70 microseconds. Thus, the combination of delay line 15 and phase discriminator 17 will act as a frequency discriminator having a periodic response characteristic.

By feeding this discriminator output back to the VCO 11 through a suitable conditioning amplifier, such as operational amplifier 19, frequency can be stabilized at any of the positive-going X-axis crossings of the discriminator output. Assuming that VCO 11 is stabilized at one of these possible frequencies, fine tuning of the VCO output over a range of 14 kHz. results from swinging the varactor phase shifter over its 360° range by means of a control input voltage at 21. Since this is accomplished by a 10 volt swing in control voltage in the present example, there is at this point an overall VCO characteristic of 1.4 kHz./volt, a desirably low sensitivity more characteristic of a voltage controlled crystal oscillator than of a conventional VCO.

If the VCO is to be used, for example, in a synthesizer as described above and if the synthesizer loop logic computes a frequency error that is greater than 14 kHz. then its design can be such as to produce an error signal of up to ±10 volts, the polarity depending upon the sense of the error. However, the circuit of FIG. 1 incorporates Zener diodes 23 and 24 which break down when the control input voltage exceeds ±7 volts. And when these diodes begin to conduct their impedance becomes low compared to that of the branch circuit consisting of C2 and R2 so that the AFC signal from the discriminator 17 is overridden. As a result of this, the operational amplifier 19 acts effectively as an integrator with a time constant determined by C1 and R3, and the slewing rate of the VCO 11 will be determined by the excess of the control voltage applied over the ±7 volt threshold of the Zener diodes. The VCO 11 frequency will then slew until the frequency error is reduced to less than 14 kHz., at which point there is a corresponding reduction in the control voltage below the 7-volt threshold, and the delay-line discriminator 17 can again come into play.

In the numerical example used in FIG. 1, the total tuning range of the VCO is 1 MHz. Thus, it is seen that when VCO 11 is in the fine tuning mode, corresponding to a phase-lock condition in the synthesizer, the tuning slope is such that, extrapolated, a 700-volt swing would be required to cover the entire VCO output tuning range. In practical terms, it is this enormous increase in effective control voltage range which is responsible for the improvement in the short term frequency stability. Referring to the earlier example, a control-voltage noise level of almost 1 mv. could be tolerated without exceeding a 1 p.p.m. frequency jitter.

With respect to the choice of delay time T, there exists a situation in certain respects analogous to the delay-line filter used in MTI radar. Considering the phase variation Φs of the VCO output as the variable of interest and making the usual linearizing approximation, the transfer function with respect to phase noise $\theta_n$ s arising within the internal VCO of FIG. 1 takes the form $$\varphi(s)=\frac{\Theta_n(s)}{\frac{k}{s}F(s)[1-e^{-sT}]+1}$$

In this expression, the term $k/s$ describes the transfer function of the VCO (the gain of the phase discriminator is incorporated into $k$). For Fs describes the transfer function of the operational amplifier network, while the expression in brackets describes the action of the delay-line discriminator.

FIG. 2 illustrates in qualitative terms the effect of the internal frequency feedback loop. The voltage-controlled oscillator which is internal to the circuit of FIG. 1 will typically have a spectrum of phase-noise as illustrated in FIG. 2*a*. The total mean-square phase jitter will be proportional to the area under the curve.

The effect of the delay-line discriminator loop is to create a comb filter having narrow passbands of bandwidth B spaced at harmonics of 1/T, where T is the amount of delay used as shown in FIG. 2*b*. Thus, with a 70 micro second delay-line the interval between passbands in the comb filter will be 14 kHz. The resulting output spectrum for the ultrastable VCO will then be as shown in FIG. 2*c*. This spectrum is the result of weighting the spectrum of FIG. 2A with the filter function of FIG. 2B. The bandwidth of the main lobe is sharply decreased. However, the stabilizing action of the delay discriminator loop is ineffective for phase-noise components which are close to harmonics of the 14 kHz. characteristic frequency associated with the delay-line. If the delay is reduced, these "blind" frequencies become more widely separated, but the bandwidth of the main lobe is correspondingly increased.

If the width of the main lobe is small compared to the reference frequency, then, of course, the digital control loop will be effective in cleaning up these noise sidebands. If at the same time the delay is sufficiently short, then the first blind frequency which, in the present numerical example, falls at 14 kHz. will occur in a frequency range where the phase-noise spectral density has fallen off substantially from the value that it has close to DC.

Glass or quartz delay lines having bandwidths approaching one octave with center frequencies from 4 MHz. to 80 MHz. are readily available as compact units as well as other delay line units. In the present application, no stringent requirement is placed on delay stability, insertion loss, or spurious response.

Although the above-described oscillator is preferable for most applications, for certain special applications, the approach in which the delay-line is within the primary RF as illustrated in FIG. 3 may be used. Here, we see a form of positive feedback oscillator 30 consisting of a band-pass amplifier 31, an amplitude limiter 32 and a delay-line 33, all having bandwidths encompassing the desired tuning range of the oscillator. It is well known that the combination of delay-line, amplifier, and limiter will act as a "multimode" oscillator, capable of oscillating at each of a number of frequencies separated by the reciprocal of the loop delay T. This ambiguity of operating frequency is resolved by incorporating into the loop a turnable resonator 40 including the two-section filter 34 and 37 in FIG. 3 and voltage-tuned by means of varactors 36 and 35.

The resonator 40 causes the loop gain to fall below the critical value of unity except for the particular mode frequency falling within the passband of the filter. The circuit will then oscillate at this particular frequency, vernier tuning of frequency being achieved by controlling phase shift through the above-mentioned filter. As the phase slope for the loop gain function will be high as a result of the delay line, the desired object of a high effective Q factor leading to improved short term stability results.

The delay-line 33 increases the phase slope in the loop transfer function of the oscillator so that external disturbances will have a lesser effect on oscillator frequency.

It is to be understood that the above description and accompanying drawings are illustrative only and that the invention is to be limited only by the scope of the following claims.

I claim:

1. A frequency tuned oscillator system comprising
an electronic tunable oscillator;
a delay-line;
a phase shifter coupled between the output of said oscillator and the input of said delay-line;
a phase discriminator coupled to the output of said oscillator and the output of said delay-line; and
means for controlling the frequency of said oscillator in response to the output of said phase discriminator so as to maintain the equality
$2\pi FT+\theta=$ multiple of $2\pi$ where
F = output frequency of said oscillator
T = delay of said delay-line
$\theta$ = phase shift in radians of said phase shifter.

2. The system of claim 1 further comprising
means for varying the phase shift $\theta$ of said phase shifter through a total excursion of at least 2 radians, so as to provide frequency adjustments up to 1/T.

3. A frequency stabilized tunable oscillator system comprising
an electronically tunable oscillator;
a delay-line of predetermined bandwidth and having a delay T coupled to and driven by the output of said oscillator;
a controllable phase shifter connected between the output of said oscillator and said delay line;
means for measuring the phase difference between the output signal from said delay-line and the output signal from said tunable oscillator;
means for providing an error signal corresponding to said phase difference; and
means dynamically controlling the frequency of said oscillator in accordance with said error signal for reducing said error signal whereby the frequency will be restored to its undisturbed value.

4. The system of claim 3 wherein said electronically tuned oscillator is voltage controlled.

5. The system of claim 3 further comprising means for overriding said error signal so as to permit large changes in output frequency.

6. A frequency stabilized tunable oscillator system comprising
active amplifying circuit means;
tunable resonator means connected to said amplifying circuit means so as to provide a positive feedback loop; and delay-line means coupled between said resonator and the input of said amplifying circuit means for increasing the phase slope in the transfer function of said loop so as to reduce the effect of external disturbances on the oscillator frequency.

7. The system of claim 7 wherein said tunable resonator means comprises a two-section filter, and varactors for voltage-tuning said filters.